United States Patent
Koike et al.

(10) Patent No.: US 9,391,148 B2
(45) Date of Patent: Jul. 12, 2016

(54) SiC SINGLE CRYSTAL SUBSTRATE

(71) Applicant: MITSUI MINING & SMELTING CO., LTD., Tokyo (JP)

(72) Inventors: Atsushi Koike, Saitama (JP); Yasunori Tabira, Saitama (JP); Ryuichi Sato, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 14/394,525

(22) PCT Filed: Apr. 12, 2013

(86) PCT No.: PCT/JP2013/061096
§ 371 (c)(1),
(2) Date: Oct. 15, 2014

(87) PCT Pub. No.: WO2013/161591
PCT Pub. Date: Oct. 31, 2013

(65) Prior Publication Data
US 2015/0084065 A1 Mar. 26, 2015

Related U.S. Application Data (63) Continuation of application No. PCT/JP2012/061334, filed on Apr. 27, 2012.

(51) Int. Cl.
*H01L 29/34* (2006.01)
*C30B 29/36* (2006.01)
(Continued)

(52) U.S. Cl.
CPC ............ *H01L 29/34* (2013.01); *C09K 3/1463* (2013.01); *C30B 29/36* (2013.01); *C30B 33/00* (2013.01); *H01L 21/02024* (2013.01); *H01L 21/3212* (2013.01); *H01L 29/1608* (2013.01)

(58) Field of Classification Search
CPC ........................... H01L 29/34; H01L 29/1608
USPC ........................................................ 438/690
See application file for complete search history.

(56) References Cited

U.S. PATENT DOCUMENTS

| 2003/0153183 A1 | 8/2003 | Konno et al. |
| 2004/0040217 A1 | 3/2004 | Takashina et al. |

(Continued)

FOREIGN PATENT DOCUMENTS

| JP | 2004-146780 | 5/2004 |
| JP | 2006-261563 | 9/2006 |

(Continued)

OTHER PUBLICATIONS

Hasegawa et al., Single Crystal SiC CMP using manganese oxide slurry Characteristics under high pressure atomosphere in bell-jar CMP machine, Sep. 2011, E##, p. 375-376.*

(Continued)

*Primary Examiner* — Samuel Gebremariam
(74) *Attorney, Agent, or Firm* — Young & Thompson (57) ABSTRACT

A single crystal SiC substrate capable of forming a good epitaxial thin film thereon to give a high-quality epitaxial substrate is provided. The single crystal SiC substrate has a CMP-treated surface and has 5 or fewer lattice defects measuring 30 nm or more in a direction parallel to the polished surface and 50 nm or more in a direction perpendicular to the polished surface as counted within a depth of 100 nm from the polished surface in a direction perpendicular to the polished surface and a length of 10 μm in a direction parallel to the polished surface when observed in cross-section using a transmission electron microscope under the 00L reflection or the h-h0 reflection, where L and h are each an integer other than 0.

12 Claims, 7 Drawing Sheets

(51) Int. Cl.
*C30B 33/00* (2006.01)
*H01L 21/02* (2006.01)
*C09K 3/14* (2006.01)
*H01L 29/16* (2006.01)
*H01L 21/321* (2006.01)

(56) References Cited

U.S. PATENT DOCUMENTS

2010/0258528 A1* 10/2010 Singh et al. .............. 216/53
2011/0156058 A1   6/2011 Hori et al.
2013/0012102 A1   1/2013 Yamaguchi et al.

FOREIGN PATENT DOCUMENTS

| JP | 2007-266619 | 10/2007 |
| JP | 2007-311586 | 11/2007 |
| JP | 2008-227534 | 9/2008 |
| JP | 2010-003732 | 1/2010 |
| JP | 2011-049496 | 3/2011 |
| JP | 2011-218494 | 11/2011 |
| WO | 2012-043220 | 4/2012 |
| WO | 2013054883  | 4/2013 |

OTHER PUBLICATIONS

Tadashi Hasegawa et al., "Sanka Mangan-kei Slurry o Mochiita SiC Tankessho Kiban no Seimitsu Kako,—Mippeigata Kako Kankyo Control CMP Sochi ni yoru Kako Tokusei-", Proceedings of the Meeting of Japan Society of Precision Engineering, vol. 2011, 2011, E33.
International Search Report PCT/JP2013/061096 dated Jul. 9, 2013.
Tadashi Hasegawa et al., "Application of manganese slurry to CMP process of SiC substrate", The Japan Society of Mechanical Engineers Kyushu Shibu Koen Ronbunshu, 2010, vol. 63, pp. 95 to 96.

* cited by examiner

SIC SINGLE CRYSTAL SUBSTRATE

TECHNICAL FIELD

This invention relates to a single crystal SiC (silicon carbide) substrate, particularly a single crystal SiC substrate capable of forming a good, epitaxial thin film thereon to provide a high-quality epitaxial substrate.

BACKGROUND ART

SiC (silicon carbide) is a kind of wide band gap semiconductors similar to GaN or diamond. Having high heat and chemical resistance and excellent mechanical strength, SiC has been attracting attention as a semiconductor material operable in a severe environment, such as a high temperature environment, that precluded the use of conventional Si semiconductors. In recent years, there has been an increasing demand for a single crystal SiC substrate for use in high-frequency, high-voltage resistant electronic devices.

Production of a single crystal SiC substrate includes slicing an SiC single crystal ingot into wafers, grinding the as-cut wafer to a predetermined thickness using, e.g., a grinder, lapping the wafer with abrasive grains, e.g., of diamond, and polishing the lapped, wafer with finer abrasive grains to provide a mirror finish.

The production involves the step of removing a work damaged layer resulting from the grinding or lapping steps from the surface of the substrate. In order to remove the damaged, layer, it has been a practice generally followed to perform chemical mechanical polishing (CMP) using colloidal silica as abrasive grains.

If there is a defect, such as a damaged layer, on the surface of a single crystal SiC substrate on which an epitaxial thin film is to be formed, it would be difficult to well accomplish epitaxial growth, making it hard to provide an epitaxial substrate with desired characteristics and reliability. Therefore, it has been a practice to remove the damaged layer by chemical mechanical polishing (CMP) using colloidal silica abrasive grains as described in Patent Literature 1. A damaged layer is said to be present from the substrate surface to a depth of several hundreds of nanometers. Under the present circumstances, a long time is needed to achieve the CMP treatment because of the low polishing rate of colloidal silica abrasive grains.

In order to securely remove the damaged layer, it has been proposed to perform vapor phase etching in combination with a CMP treatment as disclosed in Patent Literatures 2 and 3. Patent Literature 4 proposes a process for producing an SiC epitaxial substrate including polishing a single crystal SiC substrate until the disturbed lattice layer is reduced to 3 nm or thinner, cleaning the polished, substrate at a high temperature in a hydrogen atmosphere, and epitaxially growing a thin film of silicon carbide on the cleaned substrate.

Cases are sometimes met with in which even a single crystal SiC substrate having been CMP treated for a long period of time fails to form a satisfactory epitaxial thin film. This has caused a reduction in yield of production of electronic devices involving formation of an epitaxial thin film. To perform vapor phase etching as in Patent Literatures 2 and 3 makes the production process complicated, which hinders efficient production of an epitaxial substrate.

The technique of Patent Literature 4, in which the disturbed lattice layer on the surface of a single crystal SiC substrate is removed as much as possible by polishing before the formation of an epitaxial thin film of silicon carbide, is thought to provide a high quality-epitaxial thin film. Reduction of the disturbed lattice layer on the surface of a single crystal SiC substrate assuredly seems to result in removal of the damaged layer. And yet, it is still considered that there is a room for farther investigation into factors other than the disturbed lattice layer on a polished single crystal SiC substrate in order to form a more defect-free, high-quality epitaxial thin film.

Non-Patent Literatures 1 and 2 report that a CMP treatment of an SiC substrate with an alkaline slurry containing $MnO_2$ and $MnO_4^-$ accelerates oxidation reaction, resulting in an improved, processing rate. The reports, however, are silent on the possibility of obtaining an SiC substrate with a highly precisely polished surface to a conventionally unreachable level by performing a CMP treatment under a specific condition.

CITATION LIST

Patent Literature

Patent Literature 1: JP 2007-311586A
Patent Literature 2: JP 2008-227534A
Patent Literature 3: JP 2006-261563A
Patent Literature 4: JP 2011-49496A

Non-Patent Literature

Non-Patent Literature 1: Article entitled "Single Crystal SiC CMP Using Manganese Slurry" by Hasegawa Tadashi, et al., Transactions of the JSPE (The Japan Society for Precision Engineering) 2011, vol. 2011, E33

Non-Patent Literature 2: Article entitled "Application of Manganese slurry to CMP Process of SiC Substrate" by Hasegawa Tadashi, et al., Proceedings of the JSME (The Japan Society of Mechanical Engineers) Kyushu Branch 2010, vol. 63, pp. 95-96

SUMMARY OF INVENTION

Technical Problem

In the light of the above circumstances, it is an object of the invention to provide a single crystal SiC substrate capable of securely forming a good epitaxial thin film thereon to provide a high quality epitaxial substrate.

Solution to Problem

In order to accomplish the above object, the present inventors have intensively studied on a damaged layer of a polished surface of a single crystal SiC substrate. As a result, they have succeeded in finding a lattice defect that has not been observed by conventional methods by observing a cross-section of a single crystal SiC substrate under reflections from a specific direction using a transmission electron microscope. They have also found, that the thus observed lattice defect is largely influential on the quality of an epitaxial thin film and the production yield of electronic devices. Unlike the known defects of a single crystal SiC substrate, such as scratches or roughness of a polished surface and the disturbed lattice layer dealt with in Patent Literature 4, the lattice defect the inventors have found intrudes fairly deeply from the polished surface and is believed to originate from a damaged layer. The inventors have ascertained that the lattice defect originating from a damaged, layer can be eliminated almost completely by a specific CMP treatment to remove the damaged layer at a high speed without imposing a great burden to the crystal per se of a single crystal SiC substrate.

The present invention relates a single crystal SiC substrate having a CMP-treated polished, surface, the single crystal SiC substrate having 5 or fewer lattice defects, which have a width of 30 nm or more in a direction parallel to the polished surface and a length of 50 nm or more in a direction perpendicular to the polished surface when observed in cross-section using a transmission electron microscope under the 00L reflection or the h-h0 reflection, where L and h are each an integer other than 0. The number of the lattice defects is counted, within an area of 10 µm in a direction parallel to the polished surface and from the polished surface to a depth of 100 nm in a direction perpendicular to the polished surface.

The single crystal SiC substrate according to the invention has almost no lattice defects on its surface side and therefore allows for formation of a satisfactory epitaxial thin film thereon.

The single crystal SiC substrate of the invention is identified through cross-sectional observation using transmission electron microscope (hereinafter sometimes abbreviated as TEM). TEM is a microscopy technique in which a beam of electrons is transmitted, through a specimen, the transmitted electrons are converged by an electron lens to form an image, and the image is magnified at a magnification of about several thousands of times to one-million times. In order to allow an electron beam to pass through a specimen, the thickness of the specimen must be 200 nm or less in the direction normal to the plane of observation. The single crystal SiC substrate is sliced using, e.g., a focused, ion beam (FIB) system. The lattice defect according to the invention can be confirmed by conducting TEM observation, of a cross-section of the CMP treated single crystal substrate under the 00L reflection or the h-h0 reflection, wherein L and h are each an integer except 0. In the description of the invention, the bar in Miller indices indicates a minus sign for the trailing index. The value L is preferably a multiple of 4. It is more preferred, that the TEM observation be conducted under the 004 or 1-10 reflection.

The above discussed TEM observation allows for finding a lattice defect that occurs from the surface (polished surface) of the CMP treated single crystal SiC substrate in the direction of thickness of the substrate. The inventors' study has revealed that a single crystal SiC substrate having been CMP treated in a conventional manner, namely, using colloidal silica abrasive grains shows a number of the lattice defects extending from the polished surface in the thickness direction when observed on its cross-section. As a result of further study, it has been found that the substrate is incapable of forming a good epitaxial thin film thereon even if generation of such lattice defects is controlled. The inventors have ascertained that, in order to form a good epitaxial thin film, it is necessary for the substrate to have almost no such lattice defects generating from the polished surface in the thickness direction, specifically to have 5 or fewer above-identified lattice defects (the lattice defects observable by TEM under the above described specific condition) within a length of 10 µm in a direction parallel to the polished surface and a depth of 100 nm in a direction perpendicular to the polished surface. The number of the lattice defects is preferably 3 or fewer, more preferably 1 or fewer, most preferably zero.

The term "lattice defect" as used herein denotes a site having a slight deviation from an ideal three-dimensional array of atoms or a site having a distortion of crystal lattice of an SiC single crystal, specifically a defect due to lack of an atom, distortion, or disturbance of atomic layers induced by machining, such as grinding and lapping, in the vicinity of the polished surface. It is heretofore known by cross-sectional observation that a single crystal SiC substrate has defects from its surface toward inside. However, generally known defects that have been studied are small defects generated in the vicinity of the polished surface in the final stage of polishing. For example, Patent Literature 4 deals with defects of 3 nm or smaller. In contrast, the lattice defect as referred to in the invention is a site recognizable as a vacancy, distortion or disturbance existing in the crystal structure of a TEM image of a cross-sectional of a single crystal SiC substrate and having a width of 30 nm or more in a direction parallel to the polished surface and a length (or depth) of 50 nm or more in the direction perpendicular to the polished surface. This type of a lattice defect is considered ascribable to a great load applied to the single crystal SiC substrate during grinding or lapping. Because the above-identified lattice defect intrudes deep into the inside of the substrate, it would be necessary to relatively deeply polish the surface without imposing a large load to the crystal per se in order to remove it. Although a defect near the surface could, be removed by hydrogen etching, hydrogen etching if performed on the lattice defect of interest of the invention is liable to produce an additional lattice defect under the influence of the heat applied in hydrogen etching, resulting in an increase of lattice defects. It is believed therefore that, even if hydrogen etching is conducted to remove the lattice defect intruding deep inside the substrate, elimination of such a lattice defect would not be accomplished.

The single crystal SiC substrate of the invention is obtained by CMP treatment using a polishing slurry comprising manganese oxide particles and a solution containing manganate ions. Slurry containing both solid manganese oxide particles and dissolved manganate ions exhibits high polishing performance in polishing a high hardness workpiece, such as silicon carbide or gallium nitride, and is thereby capable of efficiently removing lattice defects derived from a damaged layer.

Examples of the manganese oxide particles that can be used in the production of the single crystal SiC substrate of the invention include particles of manganese (II) oxide (MnO), dimanganese (III) trioxide ($Mn_2O_3$), manganese dioxide ($MnO_2$), and trimanganese tetroxide ($Mn_3O_4$), with particles of manganese dioxide being particularly preferred for their high oxidation power. Examples of suitable manganate ions include $MnO_4^-$, $MnO_4^{2-}$, $MnO_4^{3-}$, and $MnO_4^{6-}$, with permanganate ion ($MnO_4^-$) being particularly preferred for its high oxidation performance. A polishing slurry containing manganese dioxide particles ($MnO_2$) and permanganate ions ($MnO_4^-$) exhibits especially high polishing performance.

The manganate ion concentration of the solution in the polishing slurry is preferably 0.5 mass % or more, more preferably 1.0 mass % or more. The polishing slurry having the recited manganate ion concentration exhibits particularly high polishing performance. While a higher manganate ion concentration leads to higher polishing performance, the concentration is preferably 40 mass % or less more preferably 20 mass % or less, even more preferably 10 mass % or less, in order to secure safety on handling the polishing slurry. The manganate ion content in the polishing slurry is measured by ion chromatography or absorptiometry.

The content of the manganese oxide particles is preferably 1.0 mass % or more, more preferably 2.0 mass % or more. The polishing slurry having the recited manganese oxide particles content exhibits particularly high polishing performance. The content is preferably 35 mass % or less, more preferably 10 mass % or less, in order to secure suitable fluidity in handling the polishing slurry.

The ratio of manganate ion to manganese oxide in the polishing slurry is preferably ⅕ or higher, more preferably ½ or higher, by molar concentration. At a ratio falling within that range, a good equilibrium balance is obtained between the atoms in the manganese oxide particles and the manganate ions, and generation of the lattice defects observable through TEM observation under the specific condition is prevented effectively. The upper limit of the molar concentration ratio of manganate ions to manganese oxide is, while not influential on the polishing performance of the polishing material, preferably 5 or less, more preferably 4 or less, in order to avoid more use of expensive manganate ions than necessary in the interests of economy. The molar concentration of manganese oxide is obtained by converting the mass of the individual manganese oxide particles to an amount of substance using the corresponding molecular weight and dividing the amount of substance by the mass of a solvent. The molar concentration of the substance supplying manganate ions can be calculated in the same manner as for manganese oxide.

The polishing slurry preferably contains an alkali metal ion such as sodium or potassium ion. The existence of alkali metal ions allows the manganate ions to exist stably in the slurry while maintaining higher oxidation state. The molar ratio of the alkali metal ion, if present, to the manganate ion in the polishing slurry is preferably 1:1 to 6:1.

The solution of the polishing slurry is preferably neutral to alkaline, i.e., has a pH of 7 or more for the following reason. Although manganate ions contained in the polishing slurry of the invention are known to exhibit high oxidizing performance in an acidic solution, manganese particles coexisting with manganate ions have difficulty in maintaining a dispersed state in an acidic condition and tend to agglomerate to scratch the workpiece.

Advantageous Effects of Invention

The single crystal SiC substrate of the invention has a surface with minimal lattice defects and is therefore capable of forming a more defect-free, high quality epitaxial thin film thereon to provide a high quality epitaxial substrate.

DESCRIPTION OF EMBODIMENTS

The invention will be described by way of Examples.

Example 1

(1) Preparation of Polishing Slurry

A polishing slurry was prepared by mixing 20 g of electrolytic $MnO_2$ ($D_{50}$: 0.30 µm; specific surface area: 48.7 m$^2$/g; crystallite size: 2.0 nm; crystal structure: γ-$MnO_2$; available from Mitsui Mining & Smelting Co., Ltd.) and 980 g of pure water and adding 9.8 g of $KMnO_4$ (from Wako Pure Chemical Industries, Ltd.), followed by stirring. The same electrolytic $MnO_2$ was used in Examples 2 through 10 and Comparative Examples 1 to 3. The crystallite size was measured by the Scherrer method. The specific surface area was measured by the BET method. The average particle size $D_{50}$ is a diameter at 50% cumulative volume in the particle size distribution measured, by a laser diffraction scattering method. In the measurement of particle size distribution, the oxide particles were dispersed by ultrasonication for 3 minutes before the measurement. A laser diffraction scattering particle size analyzer, LA-920 from Horiba, Ltd. was used.

(2) Polishing Test

A CMP test was carried out using the thus prepared polishing slurry under the following conditions. A 2-inch lapped 4H—SiC substrate was used as a workpiece to be polished. The Si-face of the substrate was polished. A single side polisher BC-15 from MAT Inc. was used as a polishing device. A polishing pad SUBA #600 available from Nitta Haas Inc. was attached onto the platen. The platen was rotated at 60 rpm with a peripheral speed, of 7163 cm/min. The carrier was rotated at 60 rpm with a peripheral speed of 961 cm/min. The load applied during polishing was 200 gf/cm$^2$. The polishing slimy was fed at a rate of 200 ml/min. The polishing time was 3 hours.

(3) Evaluation of Polishing Performance

Evaluation after polishing was performed as follows. The surface roughness Ra (JIS B0601) before and after polishing was obtained by measuring the surface profile of the substrate using an atomic force microscope Dimension 3100 from Digital Instruments and analyzing the measurement data using software NanoScope 5V from the same maker. The scanning range and points were 10 µm×10 µm and 512×512, respectively. The scanning rate was 1 Hz. The polishing rate (nm/min) was calculated from the difference in mass between before and after the polishing and the density of SiC (3.10 g/cm$^3$). The results are shown in Table 1.

(4) Cross-Sectional Observation

A cross-section of the polished substrate was observed as follows. An about 8 mm-side square was cut out of the polished, substrate such that at least one of the cross-sections was the (110) plane. A 100 nm thick specimen was sliced, along the (110) plane using an FIB system, FB200 from Hitachi High-Technologies. The specimen was observed using a transmission electron microscope JEM-ARM200F from JEOL, Ltd. The magnifications in the <110> direction observation (FIG. 1A) and in bright-field observation under the 004 reflection (FIG. 1B) were 200,000, and the magnification in dark-field, observation under the 1-10 reflection (FIG. 1C) was 50,000. The same cross-sectional observation was conducted in Examples 2 through 13 and Comparative Examples 1 to 3.

Example 2

The procedure of Example 1 was followed, except for changing the amount of $KMnO_4$ to 29.4 g. The results of evaluation are shown in Table 1.

Example 3

The procedure of Example 1 was followed, except for changing the amount of $KMnO_4$ to 58.8 g. The results of evaluation are shown in Table 1.

Example 4

A polishing slurry was prepared by mixing 40 g of electrolytic $MnO_2$ powder and 960 g of pure water, adding thereto 28.8 g of $KMnO_4$, followed by stirring. The CMP test was conducted in the same manner as in Example 1, except for using the resulting polishing slurry. The results of evaluation are shown in Table 1.

Example 5

The procedure of Example 4 was repeated, except for changing the amount of $KMnO_4$ to 57.6 g. The results of evaluation are shown in Table 1.

Example 6

A polishing slurry was prepared by mixing 100 g of electrolytic $MnO_2$ powder and 900 g of pure water, adding thereto 54.0 g of $KMnO_4$, followed by stirring. The CMP test was conducted in the same manner as in Example 1, except for using the resulting polishing slurry. The results of evaluation are shown in Table 1.

Example 7

The procedure of Example 1 was repeated, except for changing the amount of $KMnO_4$ to 7.35 g. The results of evaluation are shown in Table 1.

Example 8

The procedure of Example 1 was repeated, except for changing the amount of $KMnO_4$ to 9.8 g. The results of evaluation are shown in Table 1.

Example 9

The procedure of Example 1 was repeated, except for changing the amount of $KMnO_4$ to 14.7 g. The results of evaluation are shown in Table 1.

Example 10

The procedure of Example 1 was repeated, except for changing the amount of $KMnO_4$ to 19.6 g. The results of evaluation are shown in Table 1.

Example 11

Lambda-$MnO_2$ powder ($D_{50}$: 0.72 µm; specific surface area: 16.0 m$^2$/g; crystallite size: 70 nm) obtained by acid-cleaning lithium manganate ($LiMn_2O_4$) (from Mitsui Mining & Smelting) in a 0.1 N $HNO_3$ solution at 95° C. for 120 minutes was used as polishing grains. A polishing slurry was prepared by mixing 20 g of the λ-$MnO_2$ and 980 g of pure water, adding thereto 29.4 g of $KMnO_4$ (from Wako Pure Chemical), followed by stirring. The CMP test was conducted in the same manner as in Example 1, except for using the resulting polishing slurry. The results of evaluation are shown in Table 1.

Example 12

$Mn_2O_3$ powder ($D_{50}$: 1.77 µm; specific surface area: 4.0 m$^2$/g; crystallite size: 9.7 nm) obtained by firing the electrolytic $MnO_2$ powder used in Example 1 at 800° C. was used as polishing grains. A polishing slurry was prepared by mixing 20 g of the $Mn_2O_3$ powder and 980 g of pure water, adding thereto 29.4 g of $KMnO_4$, followed by stirring. The CMP test was conducted, in the same manner as in Example 1, except for using the resulting polishing slurry. The results of evaluation are shown in Table 1.

Example 13

A polishing slurry was prepared by mixing 20 g of $Mn_3O_4$ powder ($D_{50}$: 1.04 µm; specific surface area: 4.9 m$^2$/g; crystallite size: 9.6 nm; available from Mitsui Mining & Smelting) and 980 g of pure water, adding thereto 29.4 g of $KMnO_4$, followed by stirring. The CMP test was conducted in the same manner as in Example 1, except for using the resulting polishing slurry. The results of evaluation are shown in Table 1.

Comparative Example 1

Figure 2A:
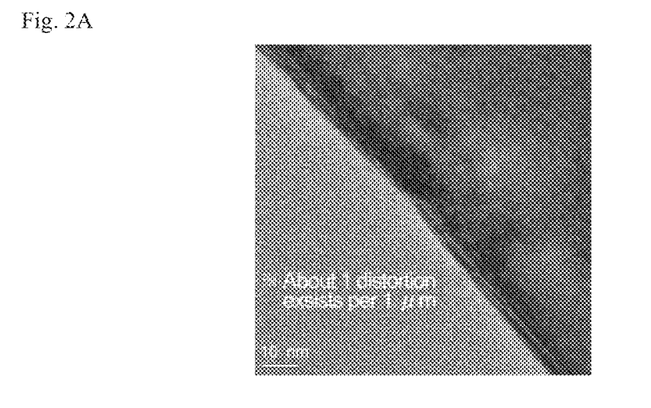
FIG. 2A is a <110> direction TEM image taken in Comparative Example 1.
Figure 2B:
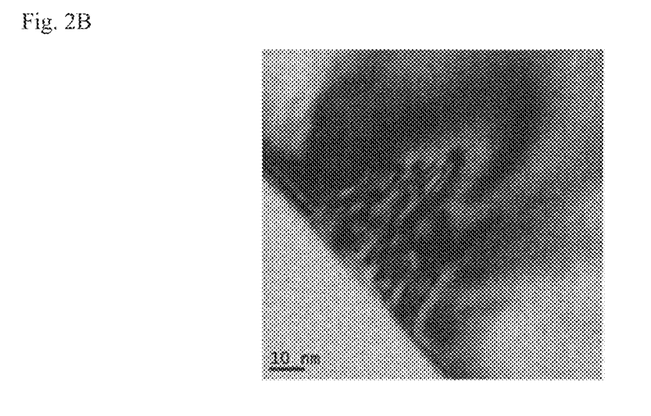
FIG. 2B is a bright-field TEM image taken under the 004 reflection in Comparative Example 1.
Figure 2C:
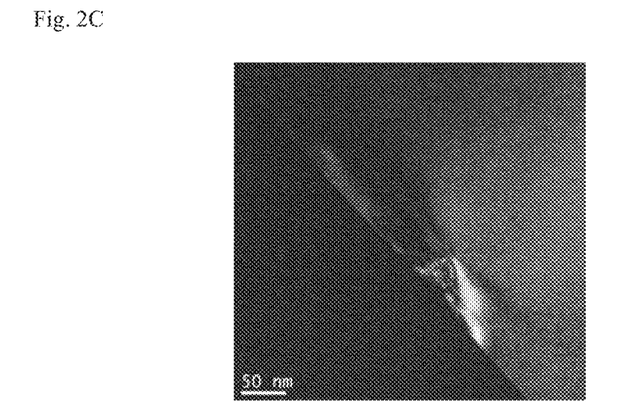
FIG. 2C is a dark-field TEM image taken under the 1-10 reflection in Comparative Example 1.

A CMP test and cross-sectional observation were performed in the same manner as in Example 1, except for using a colloidal silica slurry DSC 1001 from Fujimi Inc. as a polishing slurry. The polishing characteristics are shown in Table 1. Cross-sectional TEM images are shown in FIGS. 2A, 2B, and 2C.

Comparative Example 2

Figure 3A:
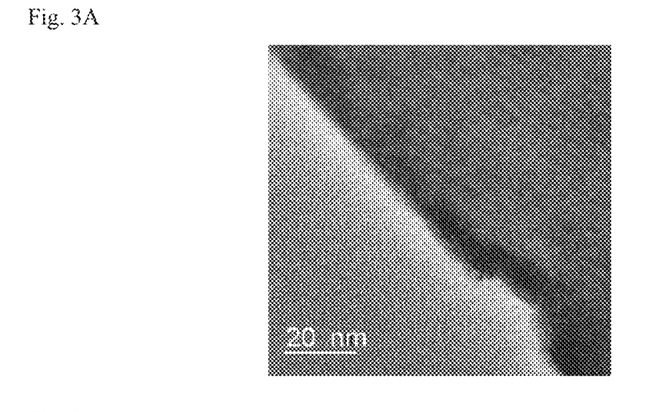
FIG. 3A is a <110> direction TEM image taken in Comparative Example 2.
Figure 3B:
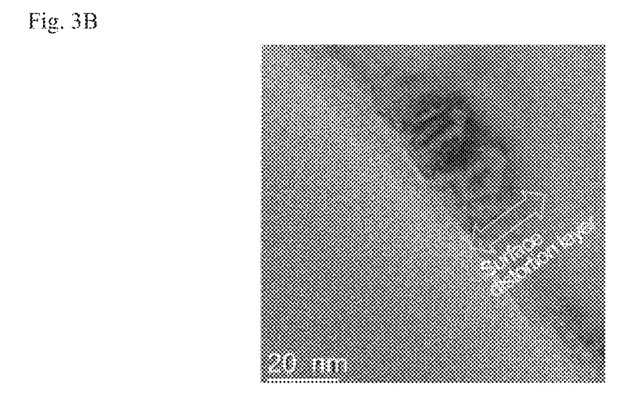
FIG. 3B is a bright-field TEM image taken under the 004 reflection in Comparative Example 2.
Figure 3C:
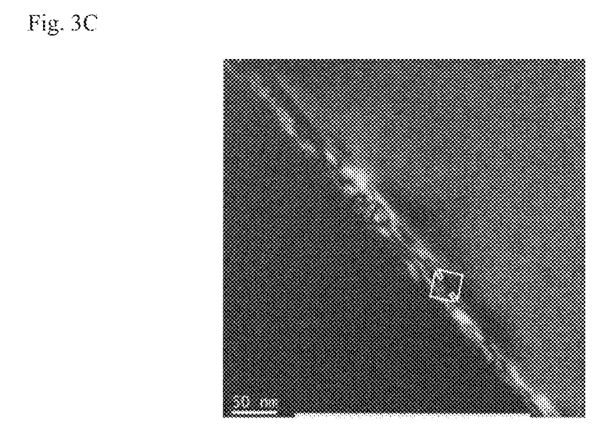
FIG. 3C is a dark-field TEM image taken under the 1-10 reflection in Comparative Example 2.

A commercially available 2-inch 4H—SiC substrate was lapped on its Si face. Lapping was carried out in the same manner as in the CMP test of Example 1, except for using, as a polishing slurry, a diamond slurry ½PCS-WB2 from Nano Factor Co., Ltd. The lapping time was 10 minutes. The resulting lapped substrate was observed on its cross-section in the same manner as in Example 1. The TEM images are shown in FIGS. 3A through 3C. The substrate used in Example 1 and Comparative Example 1 as a workpiece to be CMP-treated was the same as this lapped substrate.

Comparative Example 3

Figure 4A:
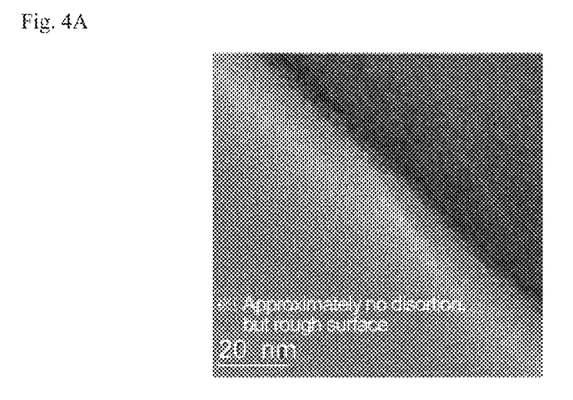
FIG. 4A is a <110> direction TEM image taken in Comparative Example 3.
Figure 4B:
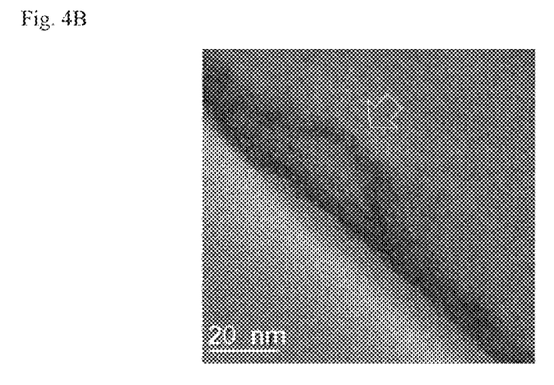
FIG. 4B is a bright-field TEM image taken under the 004 reflection in Comparative Example 3.
Figure 4C:
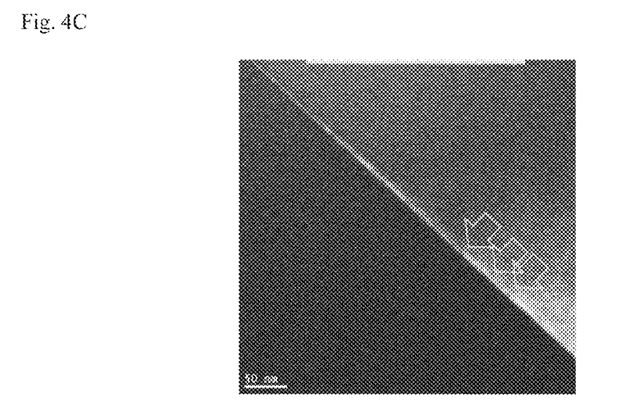
FIG. 4C is a dark-field TEM image taken under the 1-10 reflection in Comparative Example 3.

A commercially available 2-inch 4H—SiC substrate having an epiready finish (a surface ready to receive thereon epitaxial growth of thin film) was observed on its cross-section in the same manner as in Example 1. The TEM images are shown in FIGS. 4A through 4C.

Comparative Example 4

Comparative Example 4 corresponds to the technique of Non-Patent Literature 1. A polishing slurry was prepared by mixing 50 g of electrolytic $MnO_2$ powder and 950 g of pure water, adding thereto 14.5 g of $KMnO_4$, followed by stirring. The polishing performance was evaluated in the same manner as in Example 1, except for using the thus prepared polishing slurry and changing the rotational speed of the platen to 90 rpm. The results obtained are shown in Table 1.

provides confirmation of the presence of a site (lattice defect) having a distortion 30 nm or more in width (in the direction parallel to the diagonal line in the TEM image) and 50 nm or more in length (in the direction perpendicular to the diagonal line). The presence of a site (lattice defect) with a distortion 30 nm or more in width (in the direction parallel to the diagonal line in the TEM image) and 50 nm or more in length (in the direction perpendicular to the diagonal line) is also confirmed on the dark-field TEM image under the 1-10 reflection shown in FIG. 2C.

Comparative Example 2 dealt with a lapping treatment before a CMP treatment with intent to observe the condition of a work damaged layer after the lapping. When TEM observation was made in the <110> direction, presence of a large

TABLE 1

| | Polishing Slurry | | | | | | | Results of Evaluation | |
|---|---|---|---|---|---|---|---|---|---|
| | Polishing Grains | Polishing Grains Concn. | B | Manganate Ion | A | | | Polishing Rate | Surface Roughness Ra |
| | Kind | (mass %) | (mol/L) | Concn. (mass %) | (mol/l) | A/B | pH | (nm/min) | after Polishing (nm) |
| Example 1 | $MnO_2$ | 1.98 | 0.23 | 0.73 | 0.06 | 0.270 | 8.1 | 9.28 | 0.133 |
| Example 2 | | 1.94 | 0.23 | 2.15 | 0.19 | 0.809 | 8.0 | 12.35 | 0.122 |
| Example 3 | | 1.89 | 0.23 | 4.18 | 0.38 | 1.617 | 9.0 | 12.17 | 0.104 |
| Example 4 | | 3.89 | 0.48 | 2.11 | 0.19 | 0.396 | 8.6 | 11.90 | 0.136 |
| Example 5 | | 3.78 | 0.48 | 4.10 | 0.38 | 0.792 | 8.6 | 12.50 | 0.132 |
| Example 6 | | 9.49 | 1.28 | 3.86 | 0.38 | 0.297 | 9.1 | 10.73 | 0.122 |
| Example 7 | | 1.99 | 0.23 | 0.55 | 0.05 | 0.202 | 7.8 | 9.57 | 0.068 |
| Example 8 | | 1.98 | 0.23 | 0.73 | 0.06 | 0.270 | 7.6 | 9.37 | 0.077 |
| Example 9 | | 1.97 | 0.23 | 1.09 | 0.09 | 0.404 | 7.6 | 10.73 | 0.079 |
| Example 10 | | 1.96 | 0.23 | 1.45 | 0.13 | 0.539 | 7.9 | 11.19 | 0.075 |
| Example 11 | $\lambda$-$MnO_2$ | 1.94 | 0.23 | 2.15 | 0.19 | 0.810 | 7.9 | 8.30 | 0.126 |
| Example 12 | $Mn_2O_3$ | 1.94 | 0.13 | 2.15 | 0.19 | 0.730 | 5.7 | 8.08 | 0.194 |
| Example 13 | $Mn_3O_4$ | 1.94 | 0.09 | 2.15 | 0.19 | 0.710 | 9.6 | 8.15 | 0.196 |
| Compara. Example 1 | $SiO_2$ | 26.7 | — | 0 | 0 | — | 7.2 | 0.22 | 0.570 |
| Compara. Example 4 | $MnO_2$ | 5.00 | 0.61 | 0.10 | 0.1 | 0.170 | 11.0 | 2.08 | — |

A: Manganate ion concentration in slurry (mol/l)
B: Manganese ion concentration in polishing grains of slurry (mol/l)

Figure 1A:
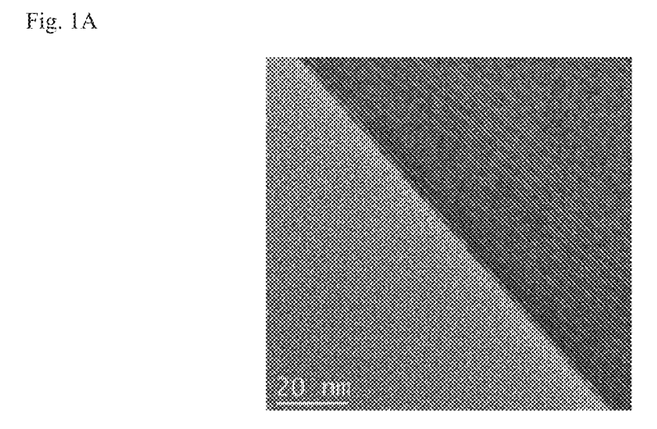
FIG. 1A is a <110> direction TEM image taken in Example 1.
Figure 1B:
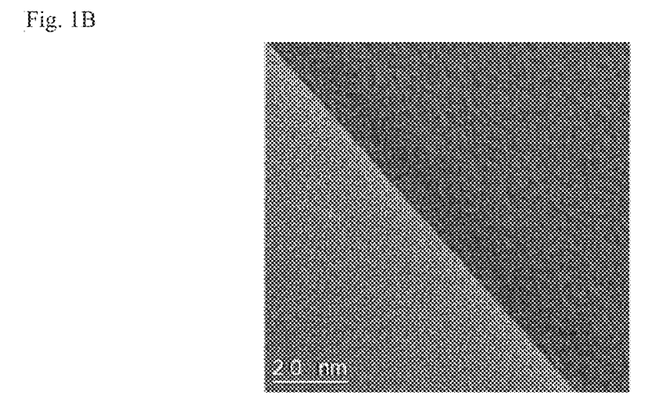
FIG. 1B is a bright-field TEM image taken under the 004 reflection in Example 1.
Figure 1C:
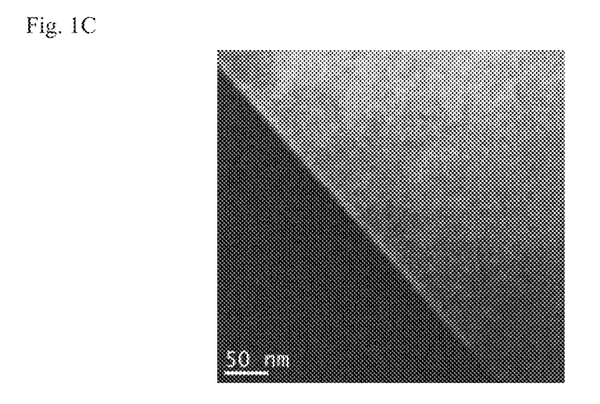
FIG. 1C is a dark-field TEM image taken under the 1-10 reflection in Example 1.

An interpretation on the TEM images of FIGS. 1A through 1C is given below. The central diagonal line from upper left to lower right in FIG. 1A is the boundary of the specimen. The right upper part above the diagonal line is the SiC single crystal structure. Likewise, the right upper part above the central diagonal line in FIGS. 1B and 1C is the single crystal SiC substrate side. The same applies to FIGS. 2A through 4C.

As displayed in FIG. 1A, observation in the <110> direction gives confirmation of the SiC single crystal structure in which lattices are periodically stacked (a single layer has a thickness of about 1 nm) and the smooth polished surface of the single crystal SiC substrate. Neither the bright-field image under the 004 reflection shown in FIG. 1B nor the dark-field image under the 1-10 reflection shown in FIG. 1C reveals a site like a lattice defect.

While not shown in the drawings, it was confirmed that the single crystal SiC substrate obtained in Examples 2 through 13 had a smooth polished surface similarly to that of Example 1. Furthermore, no site like a lattice defect was observed at ail in each of the bright-field and dark-field image under the 004 and 1-10 reflections, respectively.

In contrast to this, the <110> direction TEM image taken in Comparative Example 1, in which the CMP treatment was carried out using colloidal silica, shows a site with a slight disturbance in polished surface smoothness. The bright-field TEM image taken under the 004 reflection shown in FIG. 2B concave defect on the polished surface was revealed as shown in FIG. 3A. The bright-field TEM image under the 004 reflection (FIG. 3B) provides confirmation of the presence of a site (lattice defect) with a distortion 40 nm or more in width in the direction parallel to the diagonal line and 20 nm or more in length in the direction perpendicular to the diagonal line. Similarly, the dark-field TEM image under the 1-10 reflection (FIG. 3C) also provides confirmation of the presence of a site (lattice defect) with a distortion 40 nm or wider in the direction parallel to the diagonal line and 50 nm or deeper in the direction perpendicular to the diagonal line. It was thus confirmed that the single crystal SiC substrate before being subjected to the CMP treatment of Example 1 obviously has a defect derived from work damage.

In Comparative Example 3, a commercially available epiready substrate was observed. As shown in FIG. 4A, a site like a lattice defect was not obviously found on the polished surface when observed in the <110> direction as shown in FIG. 4A. However, in bright-field observation under the 004 reflection (FIG. 4B), the presence of a site (lattice defect) with a distortion 30 nm or more in width in the direction parallel to the diagonal line and 20 nm or more in length in the direction perpendicular to the diagonal line was confirmed. The presence of a site (lattice defect) with a distortion of 40 nm or more in width in the direction parallel to the diagonal line and about 20 nm in depth in the direction perpendicular to the diagonal line was confirmed in dark-field observation under the 1-10 reflection.

Figure 5:
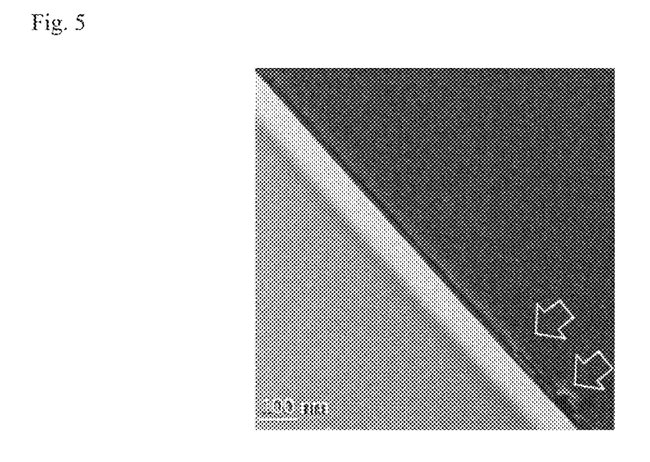
FIG. 5 is a TEM image on which lattice defects were counted in Comparative Example 1.
Figure 6:
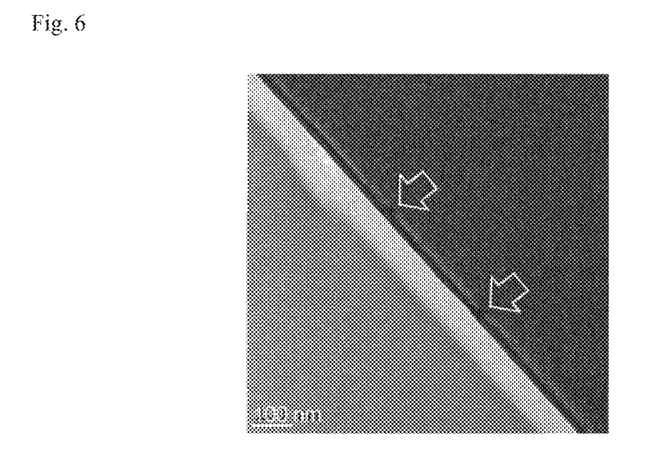
FIG. 6 is a TEM image on which lattice defects were counted in Comparative Example 1.

FIGS. 5 and 6 are bright-field TEM images taken of the single crystal SiC substrate of Comparative Example 1 under the g=[004] reflection at a magnification of 20,000 times, on which the number of lattice defects was counted. The central diagonal line from upper left to lower right in FIGS. 5 and 6 is the boundary of the specimen. In these drawings, too, the right upper part above the diagonal line is the SiC single crystal structure. In FIGS. 5 and 6, the sites indicated by the arrows were regarded as lattice defects, and the number of them was counted. A count was taken within an area of 100 nm in a direction perpendicular to the polished surface by 10 µm from the polished surface in a direction parallel to the polished surface (the direction of the diagonal line of the TEM image). As a result of examining the specimen of Comparative Example 1 at 5 locations, there were at least 6 and, in some locations, about 20 to 30 lattice defects in a 10 µm long area. The observed lattice defects were within a depth of 100 nm from the polished surface. The CMP-treated substrate of Example 1 was inspected for the number of lattice defects in the same manner. Seeing that the substrate of Example 1 had no lattice defect as demonstrated in FIGS. 1A to 1C, the number of lattice defects within a length of 10 µm along the direction parallel to the polished surface (the direction of the diagonal line in TEM images) was zero.

Figure 7A:
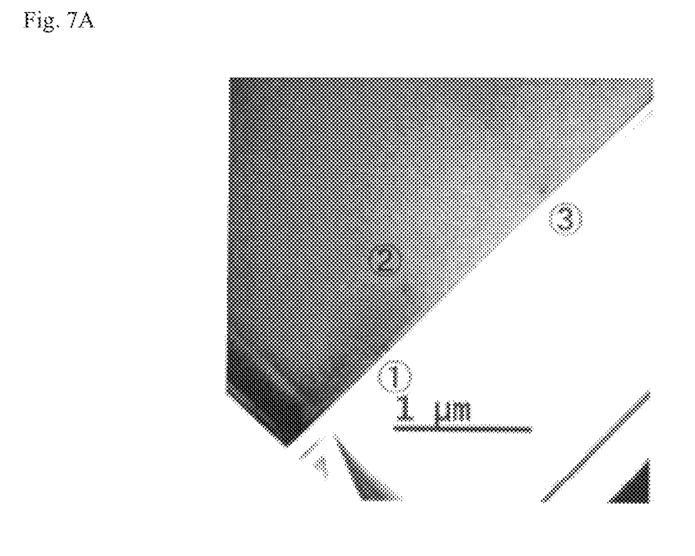
FIG. 7A is a <110> direction TEM image taken in Comparative Example 4.
Figure 7B:
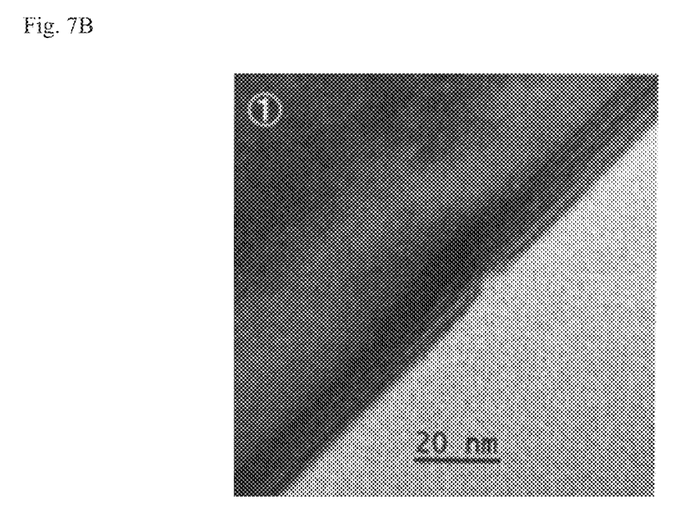
FIG. 7B is a bright-field TEM image taken under the 004 reflection in Comparative Example 4.
Figure 7C:
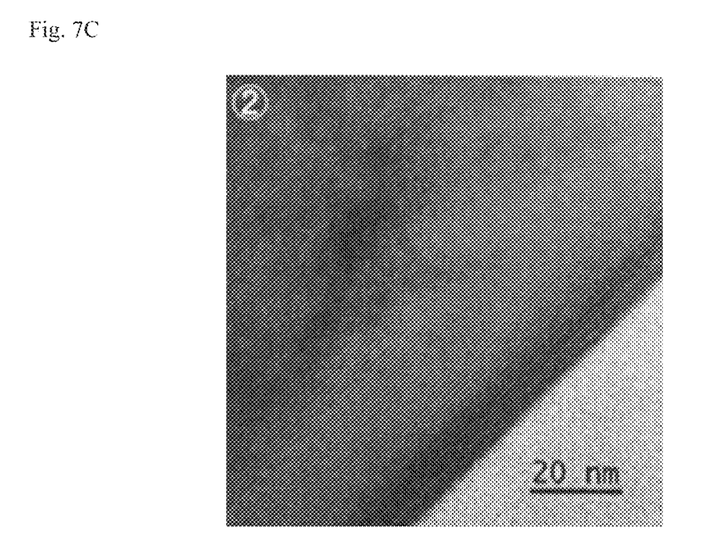
FIG. 7C is a bright-field TEM image taken under the 004 reflection in Comparative Example 4.
Figure 7D:
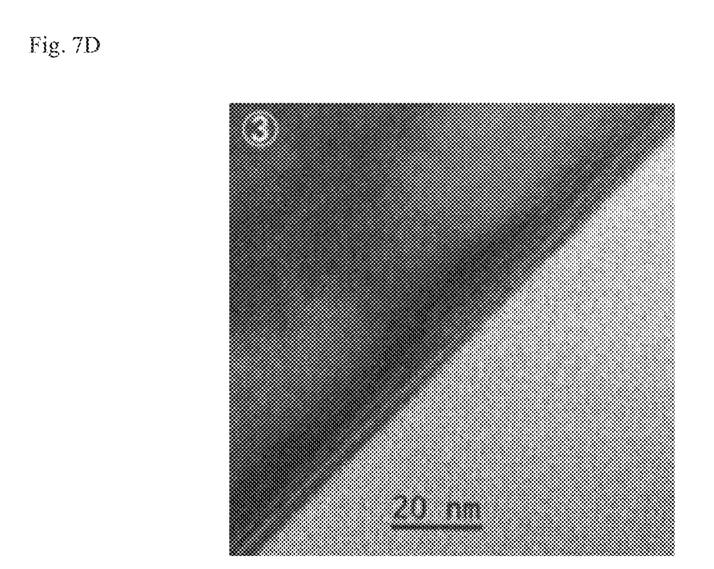
FIG. 7D is a bright-field TEM image taken under the 004 reflection in Comparative Example 4.

TEM images of the substrate of Comparative Example 4, which represents the technique of Non-Patent Literature 1 are shown in FIGS. 7A through 7D. FIG. 7A shows a cross-section taken in the <110> direction, in which the dark left upper half is the substrate side. FIGS. 7B, 7C, and 7D are bright-field TEM images (×200,000) under the 004 reflection of the sites numbered 1 to 3, respectively, in FIG. 7A. FIGS. 7B to 7D provide confirmation of the presence of a site (lattice defect) with a distortion 30 nm or wider in the direction of the diagonal line in the TEM images and 50 nm or longer in the direction perpendicular to the diagonal line. There were found 10 such lattice defects in an area within a depth of 100 nm in the direction perpendicular to the polished surface and within a length of 10 µm in the direction parallel to the polished surface.

INDUSTRIAL APPLICABILITY

The present invention allows for efficient production of a high quality epitaxial substrate.

The invention claimed is:

1. A single crystal SiC substrate having a CMP-treated polished surface,
wherein the single crystal SiC substrate has 5 or fewer lattice defects, which have a width of 30 nm or more in a direction parallel to the polished surface and a length of 50 nm or more in a direction perpendicular to the polished surface, as counted within a depth of 100 nm from the polished surface in a direction perpendicular to the polished surface and a length of 10 µm in a direction parallel to the polished surface when observed in cross-section using a transmission electron microscope under the 00L reflection or the h-h0 reflection, where L and h are each an integer other than 0;
and wherein the CMP treatment is carried out using a polishing slurry containing manganese oxide particles and manganate ions;
the manganate ion concentration in the polishing slurry is from 0.5 to 40 mass %, and the manganese oxide particles content is from 1.0 to 35 mass %; and
the molar ratio of manganate ion to manganese oxide in the polishing slurry is ⅕ or higher.

2. The single crystal SiC substrate according to claim 1, wherein L is 4, or h is 1.

3. The single crystal SiC substrate according to claim 1, wherein:
the polishing slurry further comprises an alkali metal ion; and
the molar ratio of the alkali metal ion to the manganate ion is 1:1 to 6:1.

4. The single crystal SiC substrate according to claim 1, wherein the polishing slurry has a pH of 7 or more.

5. The single crystal SiC substrate according to claim 1, wherein the polishing slurry has a pH of from 7 to 9.6.

6. The single crystal SiC substrate according to claim 1, wherein
the manganate ion concentration in the polishing slurry is from 0.5 to 10 mass %, and the manganese oxide particles content is from 1.0 to 10 mass %; and
the ratio of manganate ion to manganese oxide in the polishing slurry is from ⅕ to 4 by molar concentration.

7. A method for preparing a single crystal SiC substrate having a CMP-treated polished surface,
the single crystal SiC substrate having 5 or fewer lattice defects, which have a width of 30 nm or more in a direction parallel to the polished surface and a length of 50 nm or more in a direction perpendicular to the polished surface, as counted within a depth of 100 nm from the polished surface in a direction perpendicular to the polished surface and a length of 10 µm in a direction parallel to the polished surface when observed in cross-section using a transmission electron microscope under the 00L reflection or the h-h0 reflection, where L and h are each an integer other than 0;
the method comprising performing a CMP treatment using a polishing slurry containing manganese oxide particles and manganate ions,
wherein the manganate ion concentration in the polishing slurry is from 0.5 to 40 mass % and the manganese oxide particles content is from 1.0 to 35 mass %, and
the molar ratio of manganate ion to manganese oxide in the polishing slurry is ⅕ or higher.

8. The method according to claim 7, wherein L is 4, or h is 1.

9. The method according to claim 7, wherein the polishing slurry further comprises an alkali metal ion, and the molar ratio of the alkali metal ion to the manganate ion is 1:1 to 6:1.

10. The method according to claim 7, wherein the polishing slurry has a pH of 7 or more.

11. The method according to claim 7, wherein the polishing slurry has a pH of from 7 to 9.6.

12. The method according to claim 7, wherein
the manganate ion concentration in the polishing slurry is from 0.5 to 10 mass % and the manganese oxide particles content is from 1.0 to 10 mass %, and
the ratio of manganate ion to manganese oxide in the polishing slurry is from ⅕ to 4 by molar concentration.

* * * * *